(12) United States Patent
Wang et al.

(10) Patent No.: US 12,185,452 B2
(45) Date of Patent: Dec. 31, 2024

(54) DISPLAY DEVICE AND CIRCUIT BOARD

(71) Applicants: Hefei Xinsheng Optoelectronics Technology Co., Ltd., Anhui (CN); BOE Technology Group Co., Ltd., Beijing (CN)

(72) Inventors: Rui Wang, Beijing (CN); Zejun Chen, Beijing (CN); Jianjun Wang, Beijing (CN); Xiaoshi Liu, Beijing (CN); Xianfeng Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 192 days.

(21) Appl. No.: 17/802,990

(22) PCT Filed: Aug. 11, 2021

(86) PCT No.: PCT/CN2021/111924
§ 371 (c)(1),
(2) Date: Aug. 29, 2022

(87) PCT Pub. No.: WO2022/068413
PCT Pub. Date: Apr. 7, 2022

(65) Prior Publication Data
US 2023/0108158 A1 Apr. 6, 2023

(30) Foreign Application Priority Data
Sep. 30, 2020 (CN) .......................... 202011065051.4

(51) Int. Cl.
*H05K 1/02* (2006.01)
*G02F 1/13357* (2006.01)

(52) U.S. Cl.
CPC ......... *H05K 1/0231* (2013.01); *H05K 1/0201* (2013.01); *H05K 1/0234* (2013.01); *G02F 1/1336* (2013.01); *H05K 2201/10136* (2013.01)

(58) Field of Classification Search
CPC ................. H01L 33/62; H01L 25/0753; H01L 2224/16145; H01L 2224/73265;
(Continued)

(56) References Cited

U.S. PATENT DOCUMENTS 8,269,912 B2 9/2012 Lin et al.
9,532,491 B2 12/2016 Hashido
(Continued)

FOREIGN PATENT DOCUMENTS

CN 101814254 A 8/2010
CN 105744729 A 7/2016
(Continued)

OTHER PUBLICATIONS

International Search Report issued Nov. 11, 2021 in International Application No. PCT/CN2021/111924, 5 pages.
Written Opinion of the International Searching Authority issued Nov. 11, 2021 in International Application No. PCT/CN2021/111924, 4 pages.

*Primary Examiner* — Mandeep S Buttar
(74) *Attorney, Agent, or Firm* — XSENSUS LLP

(57) ABSTRACT

The present disclosure is related to a display device and a circuit board (200). The display device comprises a light-emitting module (100), a circuit board (200) and a conductive structure (300). The surface of the light-emitting module (100) is provided with a conductive portion (101). The circuit board (200) is arranged on a back face (102) of the light-emitting module (100), and has a first surface (201) close to the light-emitting module (100). The first surface (201) of the circuit board (200) is provided with an exposed external conductive layer (210), and the external conductive (Continued)

layer (210) is electrically connected to a ground wire of the circuit board (200). The conductive structure (300) is located between the circuit board (200) and the light-emitting module (100), and makes the external conductive layer (210) electrically connect to the conductive portion (101).

11 Claims, 6 Drawing Sheets

(58) Field of Classification Search
CPC ........ H01L 25/167; H05K 2201/10128; H05K 1/0259; H05K 1/0215; H05K 2201/10106; H05K 1/0216; H05K 1/0231; H05K 1/0234; H05K 1/115; H05K 1/144; H05K 2201/0919; H05K 2201/09354; H05K 1/0224; H05K 2201/09681; G02F 1/13; G02F 1/133603; G09F 9/33
USPC ........................................................ 361/719
See application file for complete search history.

(56) References Cited

U.S. PATENT DOCUMENTS

| | | | |
|---|---|---|---|
| 10,064,267 | B2 | 8/2018 | Pyun |
| 2010/0133684 | A1* | 6/2010 | Oka ..................... H01L 23/3735 |
| | | | 438/122 |
| 2010/0214199 | A1 | 8/2010 | Lin et al. |
| 2012/0161191 | A1* | 6/2012 | Cheng .................. H01L 33/486 |
| | | | 257/E33.062 |
| 2014/0176840 | A1 | 6/2014 | Hashido |
| 2017/0118834 | A1* | 4/2017 | Pyun ..................... H05K 1/144 |

FOREIGN PATENT DOCUMENTS

| | | |
|---|---|---|
| CN | 105744729 B | 4/2019 |
| CN | 109976056 A | 7/2019 |
| CN | 212873154 U | 4/2021 |
| EP | 3 160 214 A1 | 4/2017 |

* cited by examiner

DISPLAY DEVICE AND CIRCUIT BOARD

CROSS-REFERENCE

The present application is the 371 application of PCT Application No. PCT/CN2021/111924, filed on Aug. 11, 2021, which is based upon and claims the priority to the Chinese Patent Application NO. 202011065051.4, entitled "DISPLAY DEVICE AND CIRCUIT BOARD", filed on Sep. 30, 2020, the entire contents of both of which are hereby incorporated by reference.

TECHNICAL FIELD

The present disclosure relates to the field of display technologies, and in particular, to a display device and a circuit board.

BACKGROUND

In display devices, it is necessary to provide power and data signals to light emitting modules through circuit boards, so as to drive the light emitting modules to display.

It should be noted that the information disclosed in the Background section above is only for enhancing the understanding of the background of the present disclosure, and thus may include information that does not constitute prior art known to those of ordinary skill in the art.

SUMMARY

The present disclosure provides a display device and a circuit board.

According to a first aspect of the present disclosure, there is provided a display device, and the display device includes:
- a light emitting module, wherein a surface of the light emitting module is provided with a conductive portion;
- a circuit board, disposed at a back face of the light emitting module and provided with a first surface close to the light emitting module, wherein the first surface of the circuit board is provided with an exposed external conductive layer, and the external conductive layer is electrically coupled to a ground wire of the circuit board; and
- a conductive structure, located between the circuit board and the light emitting module, and enabling the external conductive layer to be electrically coupled to the conductive portion.

According to a second aspect of the present disclosure, there is provided a circuit board, and the circuit board includes a first surface and a second surface disposed oppositely; a resistive device and a capacitive device of the circuit board are disposed on the second surface; and the first surface of the circuit board is provided with an exposed external conductive layer, and the external conductive layer is electrically coupled to a ground wire of the circuit board.

BRIEF DESCRIPTION OF THE DRAWINGS

The above and other features and advantages of the present disclosure will become more apparent from the detailed description of embodiments thereof with reference to the drawings.

Figure 1:
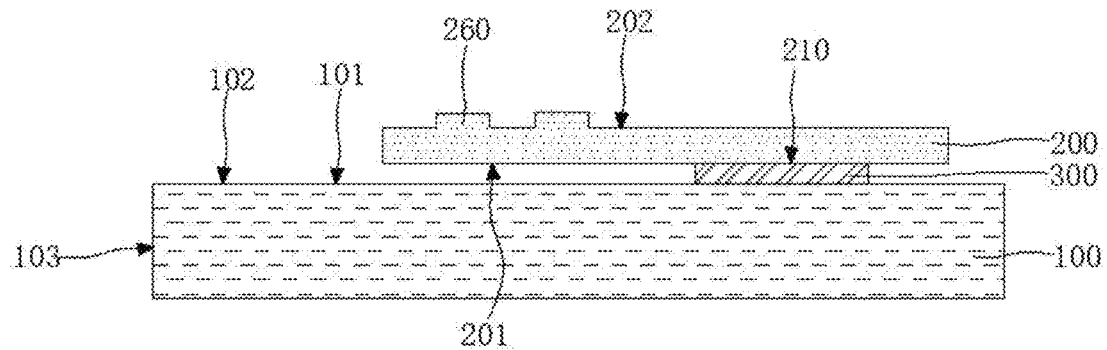
FIG. 1 is a schematic structural diagram of a display device according to an embodiment of the present disclosure.

Reference signs of main components in the figures are described as follows:

100, light emitting module; 101, conductive portion; 102, back face of a light emitting module; 103, frame of a light emitting module; 200, circuit board; 201, first surface; 202, second surface; 210, external conductive layer; 211, first external conductive layer; 212, second external conductive layer; 220, ground wire; 230, signal transmission lead; 240, bonding pad; 250, metal post; 261, resistive device; 262, capacitive device; 270, metal wiring layer; 271, first metal wiring layer; 272, second metal wiring layer; 273, third metal wiring layer; 274, fourth metal wiring layer; 275, fifth metal wiring layer; 276, sixth metal wiring layer wiring layer; 281, insulating layer; 282, organic protective layer; 300, conductive structure; 400, thermally conductive structure; A, signal transmission area; B, power management area.

DETAILED DESCRIPTION

Embodiments will now be described more fully with reference to the drawings. However, the embodiments can be implemented in a variety of forms and should not be construed as being limited to examples set forth herein; rather, these embodiments are provided so that the present disclosure will be more full and complete so as to convey the idea of the embodiments to those skilled in this art.

In the figures, thicknesses of areas and layers may be exaggerated for clarity. The same reference signs in the drawings denote the same or similar structures, and thus their detailed descriptions will be omitted.

The described features, structures, or characteristics in one or more embodiments may be combined in any suitable manner. In the following description, many specific details are provided to give a full understanding of the embodiments of the present disclosure. However, those skilled in the art will appreciate that the technical solutions of the present disclosure may be practiced without one or more of the specific details, or other methods, components, materials, and the like may be employed. In other instances, well-known structures, materials or operations are not shown or described in detail to avoid obscuring main technical ideas of the present disclosure.

When a structure is "on" another structure, it may mean that the structure is integrally formed on another structure, or that the structure is "directly" disposed on another structure, or that the structure is "indirectly" disposed on another structure through other structures. The terms "first" and "second" etc. are used only as markers, and do not limit the number of objects.

In the related art, a display device includes a light emitting module and a circuit board, and the circuit board is used to drive the light emitting module to display. The circuit board generally needs to include a signal transmission lead and a power management circuit, the signal transmission lead is used to transmit a display-related signal to the light emitting module, for example, transmit a data signal, and the power management circuit is used to provide required various voltages to the light emitting module. However, the power management circuit radiates electromagnetic waves upon operating, and the electromagnetic waves may cause noise or electromagnetic interference to the signal transmission lead and electronic components within a range of the circuit board.

Figure 2:
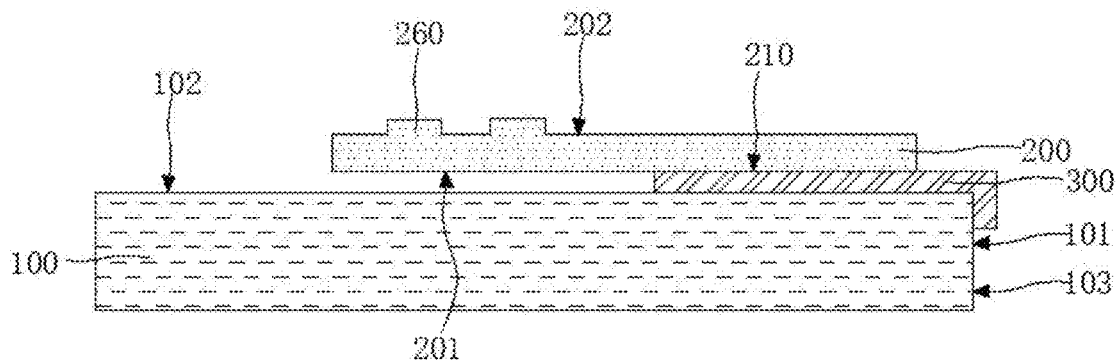
FIG. 2 is a schematic structural diagram of a display device according to an embodiment of the present disclosure.

The present disclosure provides a display device. Referring to FIG. 1 and FIG. 2, the display device includes a light emitting module 100, a circuit board 200 and a conductive structure 300. A surface of the light emitting module 100 has a conductive portion 101. The circuit board 200 is disposed at a back face 102 of the light emitting module, and has a first surface 201 close to the light emitting module 100. The first surface 201 of the circuit board 200 has an exposed external conductive layer 210, and the external conductive layer 210 is electrically coupled to a ground wire of the circuit board 200. The conductive structure 300 is located between the circuit board 200 and the light emitting module 100, and enables the external conductive layer 210 to be electrically coupled to the conductive portion 101. In FIG. 1 and FIG. 2, the first surface 201 is not attached to the back face 102 of the light emitting module, and there is a certain gap between the first surface 201 and the back face 102 of the light emitting module, so as to clearly show and distinguish the first surface 201 of the circuit board and the back face 102 of the light emitting module. In practical applications, the gap may not exist. In other words, the first surface 201 is attached to the back face 102 of the light emitting module without the gap.

In the display device provided by the present disclosure, interference electromagnetic waves generated on the circuit board 200 can be partially conducted to the external conductive layer 210, so that the external conductive layer 210 generates coupled charges and a coupled electric field, and these coupled charges and the coupled electric field can be quickly dispersed into the conductive portion 101 of the light emitting module 100 via the conductive structure 300, thereby accelerating the dissipation of the coupled charges and the coupled electric field, and reducing the interference electromagnetic waves on the circuit board 200. In the display device, the external conductive layer 210 is located on the first surface 201 close to the light emitting module 100, and the conductive structure 300 is located between the circuit board 200 and the light emitting module 100, which, on the one hand, increases a grounding area of the circuit board 200, and on the other hand, makes a distance between the external conductive layer 210 and the conductive portion 101 of the light emitting module 100 smaller, so that the coupled charges and the coupled electric field can be dissipated more quickly, thereby improving an effect of reducing the interference electromagnetic waves. More importantly, the coupled charges and the coupled electric field generated on the external conductive layer 210 can be directly dispersed to the conductive portion through the conductive structure 300 located outside the circuit board 200, reducing the transmission of the coupled charges and the coupled electric field inside the circuit board 200 through the ground wire of the circuit board 200, which can more effectively eliminate the interference of the interference electromagnetic waves on the signal transmission lead in the circuit board 200. Not only that, when static electricity is generated on the circuit board 200, the generated static electricity can also be dispersed to the conductive portion 101 of the light emitting module 100 through the external conductive layer 210 and the conductive structure 300, thereby dispersing electrostatic charges and avoiding the occurrence of electrostatic breakdown.

In this way, in the display device provided by the present disclosure, the electromagnetic interference on the circuit board 200 is weaker, which can not only ensure the normal display of the light emitting module 100, but also ensure that the circuit board 200 meets electromagnetic interference control standards.

Hereinafter, structures, principles and effects of the display device provided by the present disclosure will be further explained and described in combination with the drawings.

The present disclosure provides the display device, which can be a liquid crystal display device, an Organic Light Emitting Diode (OLED) display device, a Polymer Light Emitting Diode (PLED) display device, a Light Emitting Diode (LED) display device, a Micro Light Emitting Diode (Micro LED) display device, a Mini Light Emitting Diode (Mini LED) display device or other types of display devices. The display device can be used as a mobile phone screen, a computer screen, an outdoor billboard, an electronic instrument panel, a vehicle-mounted display screen or other display devices.

In an embodiment of the present disclosure, the display device is the liquid crystal display device, and the light emitting module 100 of the display device may include a backlight module and a liquid crystal panel that are stacked, and a surface of the backlight module away from the liquid crystal panel is the back face 102 of the light emitting module. Further, the display device is the vehicle-mounted display screen.

Figure 3:
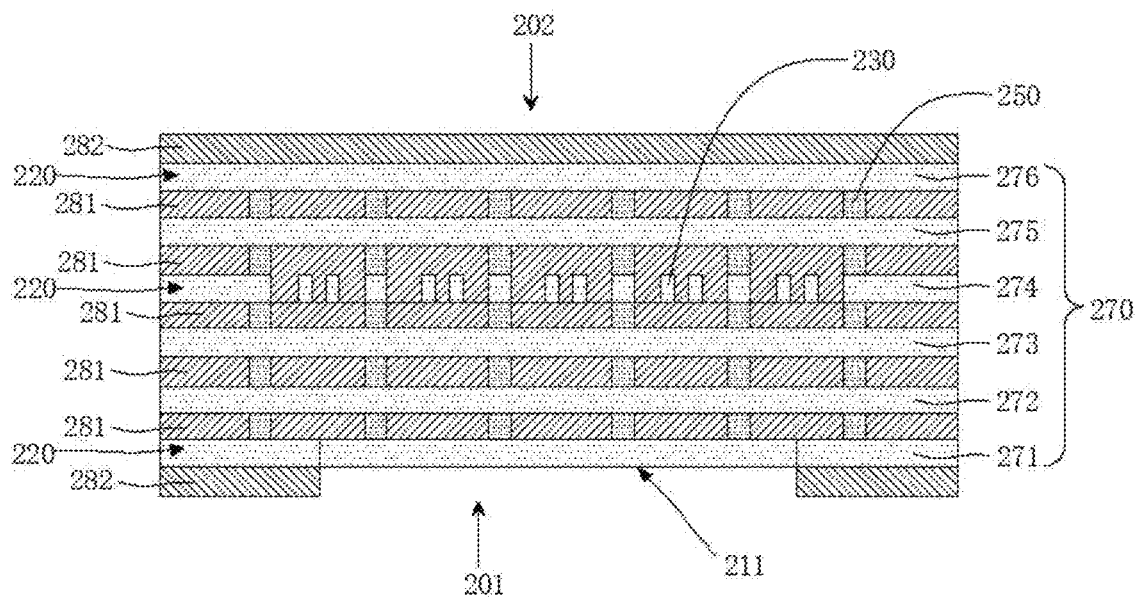
FIG. 3 is a schematic cross-sectional structural diagram of a circuit board in a signal transmission area according to an embodiment of the present disclosure.
Figure 4:
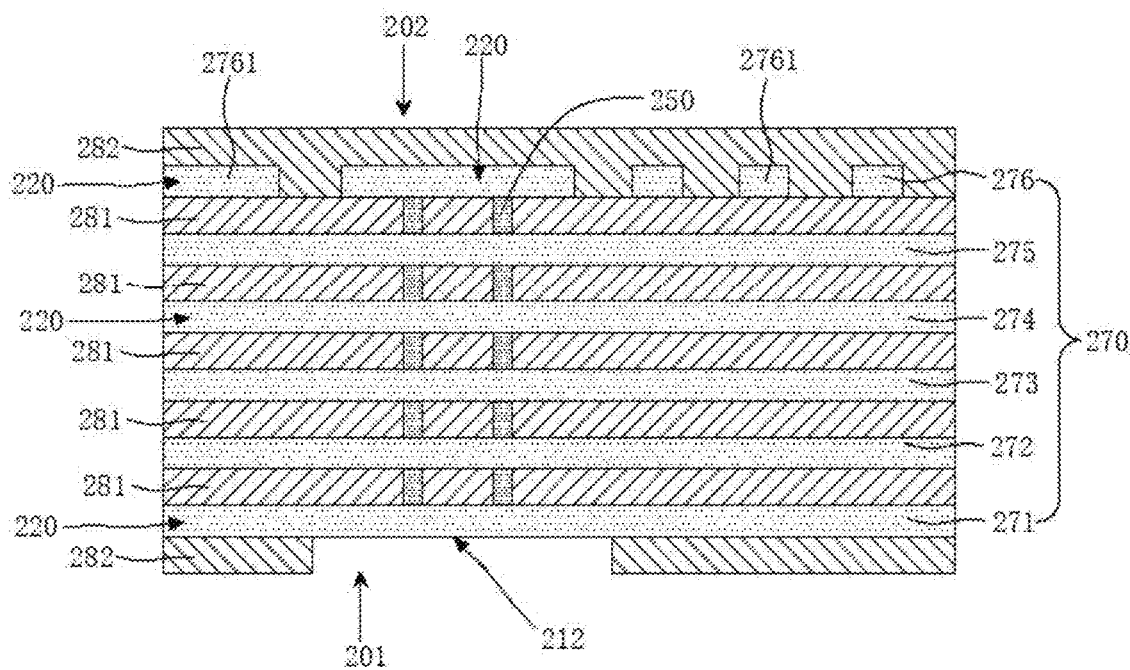
FIG. 4 is a schematic cross-sectional structural diagram of a circuit board in a power management area according to an embodiment of the present disclosure.
Figure 6:
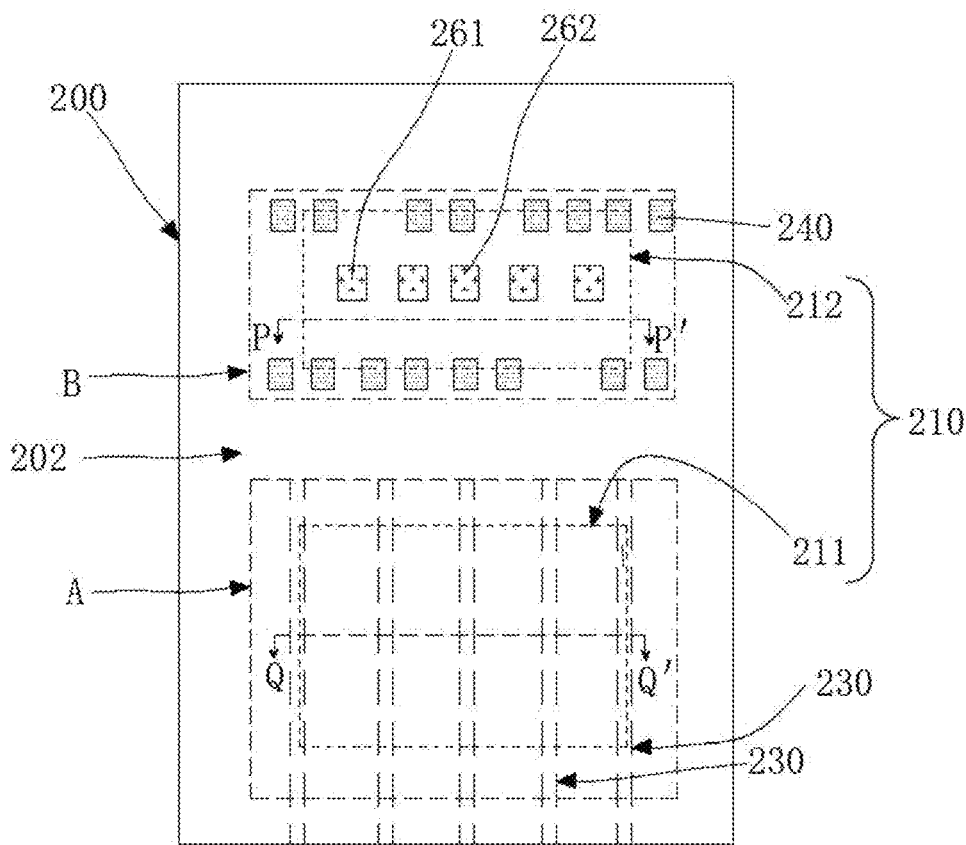
FIG. 6 is a schematic structural diagram of a second surface of a circuit board according to an embodiment of the present disclosure.

FIG. 3 is a schematic structural diagram of a circuit board cut at a QQ' position in FIG. 6, and FIG. 4 is a schematic structural diagram of a circuit board cut at a PP' position in FIG. 6. Referring to FIG. 3 and FIG. 4, the circuit board 200 provided by the present disclosure may include a plurality of metal wiring layers 270 that are stacked, and the external conductive layer 210 is located on a first metal wiring layer 271 closest to the first surface 201. An insulating layer 281 is disposed between adjacent two metal wiring layers 270, and different metal wiring layers 270 may be electrically coupled through a metal post 250 filled in a via hole. The circuit board 200 may also be provided with organic protective layers 282 on the first surface 201 of the circuit board 200 and a second surface 202 arranged opposite to the first surface 201, for example, the circuit board 200 is provided with solder resist layers, and the solder resist layers can not only protect the metal wiring layers 270, but also can achieve an effect of solder resist. In some embodiments of the present disclosure, the organic protective layer 282 may be formed by screen printing or the like, and the external conductive layer 210 of the first surface 201 is exposed when the organic protective layer 282 is formed. Further, materials of each metal wiring layer 270 and the metal post 250 are a metal copper.

Referring to FIG. 1, the circuit board 200 provided by the present disclosure further includes an electronic component 260, and the electronic component 260 may be disposed on the second surface 202 of the circuit board 200. Referring to FIG. 6, the electronic component may be a chip, a capacitive device 262, a resistive device 261, a transistor, or other electronic components. Further, a bonding pad 240 may be disposed on the metal wiring layer 270 closest to the second surface 202, and the electronic component may be bonded to the bonding pad 240, for example, the electronic component may be bonded to the bonding pad 240 by soldering, conductive glue, etc. As such, the electronic component can be electrically coupled to the metal wiring layer 270 closest to the second surface 202.

Referring to FIG. 3 and FIG. 6, the circuit board 200 provided by the present disclosure is provided with signal transmission leads 230, and the signal transmission leads 230 may be disposed on one metal wiring layer 270, or may be disposed on multiple different metal wiring layers 270. In some embodiments of the present disclosure, the signal transmission leads 230 can be disposed on an inner metal wiring layer 270, that is, the signal transmission leads 230 are disposed on a metal wiring layer 270 between the metal wiring layer 270 closest to the first surface 201 and the metal wiring layer 270 closest to the second surface 202. In this way, an anti-interference ability of the signal transmission lead 230 can be improved. Further, the circuit board 200 may be provided with the bonding pad 240 on the metal wiring layer 270 closest to the second surface 202, and the signal transmission lead 230 may be electrically coupled to the bonding pad 240 through the metal post penetrating the insulating layer 281.

Referring to FIG. 3 and FIG. 4, the circuit board 200 of the present disclosure is further provided with ground wires 220, and the ground wires 220 may be disposed at at least one or more metal wiring layers 270. In some embodiments of the present disclosure, the ground wires 220 may be disposed at individual metal wiring layers 270, and the ground wires 220 of the individual metal wiring layers 270 are electrically coupled through the metal posts 250. In this way, the ground wires 220 on the entire circuit board 200 are electrically coupled as a whole, which facilitates maintaining the stability of the signal on the entire circuit board 200 and facilitates the dissipation of interference electromagnetic waves.

In an embodiment of the present disclosure, part of the ground wires 220 in the metal wiring layer 270 closest to the second surface 202 are exposed, and the exposed ground wires 220 can be covered by a conductive tape or the like and electrically coupled to the back face 102 of the light emitting module. In this way, the interference electromagnetic waves can also be dissipated through the metal wiring layer 270 closest to the second surface 202, thereby further improving the anti-electromagnetic interference effect of the circuit board 200.

In an embodiment of the present disclosure, the display device may further include a shielding tape, and the shielding tape covers a part of the second surface 202 of the circuit board 200 and a part of the back face of the light emitting module 100, so as to fix the circuit board 200 to the back face 102 of the light emitting module and provide an electromagnetic shielding effect to the circuit board 200 to some extent.

In an embodiment of the present disclosure, referring to FIG. 3 and FIG. 4, the circuit board 200 may have six metal wiring layers 270, that is, a first metal wiring layer 271, a second metal wiring layer 272, a third metal wiring layer 273, a fourth metal wiring layer 274, a fifth metal wiring layer 275, and a sixth metal wiring layer 276 arranged in sequence. The metal wiring layer 270 closest to the first surface 201 is the first metal wiring layer 271; the metal wiring layer 270 closest to the second surface 202 is the sixth metal wiring layer 276. For example, referring to FIG. 3, the signal transmission lead 230 may be disposed at the fourth metal wiring layer 274. For another example, referring to FIG. 4 and FIG. 6, the bonding pads 240 are disposed on the sixth metal wiring layer 276, and a part of the bonding pads 240 are used to be coupled with the electronic components, for example, the bonding pads 240 are used to be coupled with the resistive devices 261 or the capacitive devices 262. The sixth metal wiring layer 276 is provided with metal traces 2761, and at least part of the electronic components are electrically coupled to the metal traces 2761. The ground wires 220 are disposed at the individual metal wiring layers 270, and the ground wires 220 of each layer are electrically coupled through the metal posts 250.

In an embodiment of the present disclosure, the signal transmission lead 230 may include a low-voltage differential signaling lead, and the low-voltage differential signaling lead is used to transmit a Low-Voltage Differential Signaling (LVDS), so as to improve the anti-interference ability of the signal transmission lead 230. For example, a controlled impedance of a pair of low-voltage differential signaling leads is 100 ohms.

Figure 5:
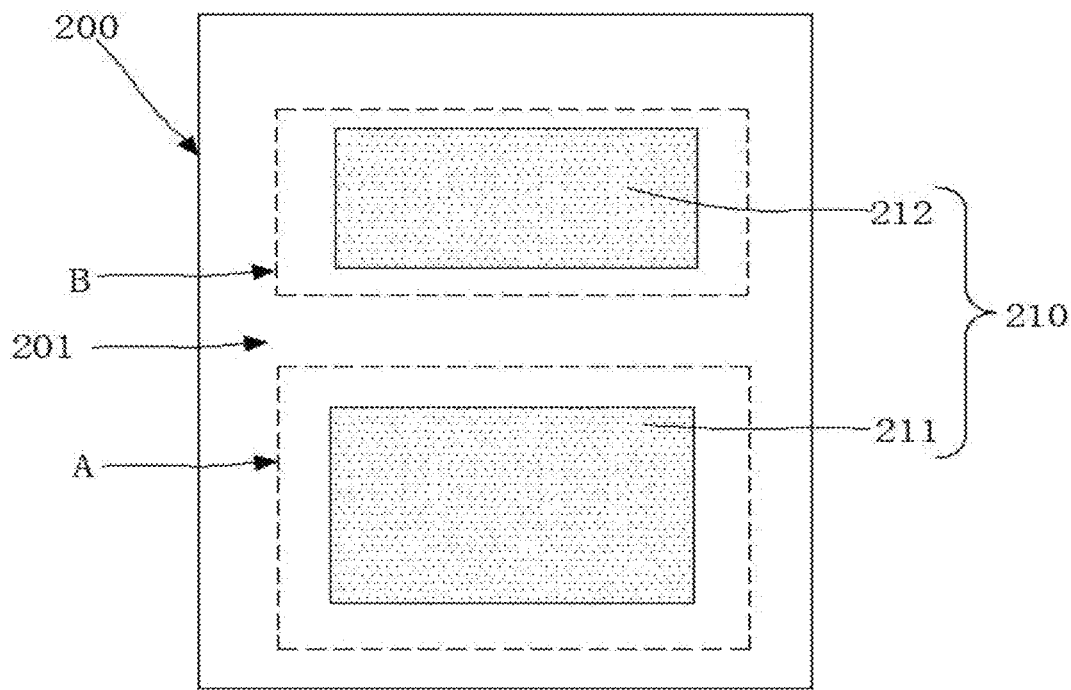
FIG. 5 is a schematic structural diagram of a first surface of a circuit board according to an embodiment of the present disclosure.

In an embodiment of the present disclosure, seen from a top view, referring to FIG. 5 and FIG. 6, the circuit board 200 has a signal transmission area A, and the signal transmission lead 230 is disposed within the signal transmission area A. The external conductive layer 210 includes a first external conductive layer 211, and an orthographic projection of the first external conductive layer 211 on a base substrate of the circuit board 200 is located within the signal transmission area A. In this way, when the interference electromagnetic waves of the circuit board 200 are conducted into the signal transmission area A, the interference electromagnetic waves can be rapidly dissipated and attenuated through the first external conductive layer 211, thereby weakening the intensity of the interference electromagnetic waves in the signal transmission area A, and the interference of the interference electromagnetic waves on the signal transmission lead 230.

In some embodiments of the present disclosure, a shape of the first external conductive layer 211 may be a rectangle, a diamond, a circle, an ellipse or other shapes. For example, the shape of the first external conductive layer 211 may be the rectangle. In an embodiment of the present disclosure, the first external conductive layer 211 may be a rectangle with a long side length of 40 mm and a short side length of 9 mm. In another embodiment of the present disclosure, the first external conductive layer 211 may be a rectangle with a long side length of 17 mm and a short side length of 7 mm. In still another embodiment of the present disclosure, the first external conductive layer 211 may be a rectangle with a long side length of 12 mm and a short side length of 7 mm. It can be understood that the above-mentioned dimensions of the first external conductive layer 211 are only examples. In other embodiments, the dimensions of the first external conductive layer 211 may be adjusted according to a size of the circuit board 200, especially according to a size of the signal transmission area A.

According to the circuit board 200 provided by the present disclosure, by providing the first external conductive layer 211, the interference of the interference electromagnetic waves on the signal transmission lead 230 can be weakened, so that the circuit board 200 can meet the electromagnetic interference control standards in more application environments. In this way, the circuit board 200 can be applied to different display devices, which improves the versatility of the circuit board 200, avoids repeated development due to development of a new circuit board 200 according to each different display device, and thus avoids problems such as prolonged research and development cycles and waste of research and development resources caused by repeated development of the circuit board 200.

In an embodiment of the present disclosure, seen from a top view, referring to FIG. 5 and FIG. 6, the circuit board 200 may include a power management area B, and a power management circuit is disposed in the power management area B. The power management circuit can be used to generate voltages with various potentials required by the light emitting module 100, so as to provide the respective required power voltages for different circuits of the light emitting module 100. For example, the power management circuit may generate a grounding voltage, a scan voltage, a driving power voltage, etc., and more interference electromagnetic waves will be generated during generating these voltages. Further, the power management circuit may include a power management chip and a voltage division circuit, and the voltage division circuit generates power voltages with different potentials through voltage division under control of the power management chip. Various electronic components of the power management circuit, such as the power management chip, the resistive device, the capacitive device, etc., can be electrically coupled to the metal wiring layer 270 of the circuit board 200 closest to the second surface 202, and can be electrically coupled through the metal traces to form the power management circuit. The required metal traces can all be disposed on the metal wiring layer 270 closest to the second surface 202, or can be partly disposed on other metal wiring layers 270. The metal traces on different metal wiring layers 270 can be electrically coupled through the metal posts.

In an embodiment of the present disclosure, the external conductive layer 210 includes a second external conductive layer 212, and an orthographic projection of the second external conductive layer 212 on the base substrate of the circuit board 200 is located within a power management area B. In this way, the interference electromagnetic waves generated by the power management area B can be quickly dissipated through the second external conductive layer 212, thereby weakening the intensity of the interference electromagnetic waves in the power management area B and the interference of the interference electromagnetic waves on the signal transmission lead 230. Correspondingly, the second external conductive layer 212 can accelerate the attenuation of the interference electromagnetic waves in the power management area B, thereby reducing the interference to the signal transmission lead 230, improving the versatility of the circuit board of the present disclosure, and reducing the repeated development of the circuit board.

It can be understood that, according to different settings of the display device, other circuit units may also be selectively disposed on the circuit board 200 according to requirements. For example, in an embodiment of the present disclosure, the circuit board 200 may have a timing control area, and a timing controller is provided in the timing control area. Further, the external conductive layer may further include a third external conductive layer, and an orthographic projection of the third external conductive layer on the base substrate of the circuit board 200 is located within the timing control area. For another example, in another embodiment of the present disclosure, the circuit board 200 may have a picture detection area, and a picture detection circuit is provided in the picture detection area. Further, the external conductive layer 210 may further include a fourth external conductive layer, and an orthographic projection of the fourth external conductive layer on the base substrate of the circuit board 200 is located within the picture detection area. For still another example, in still another embodiment of the present disclosure, the circuit board 200 may have a backlight management area, and a backlight driving circuit is provided in the backlight management area. Further, the external conductive layer 210 may further include a fifth external conductive layer, and an orthographic projection of the fifth external conductive layer on the base substrate of the circuit board 200 is located within the backlight management area.

In an embodiment of the present disclosure, the external conductive layer 210 is a non-hollow structure. In this way, it can be ensured that an electrical connection area between the external conductive layer 210 and the conductive structure 300 is maximized, and the external conductive layer 210 has a larger area to more efficiently couple the interference electromagnetic waves, so that a transfer speed of the coupled charges and the coupled electric field is faster, thereby further improving the anti-electromagnetic interference effect of the circuit board 200.

The conductive structure 300 is disposed between the light emitting module 100 and the circuit board 200 for dispersing the coupled charges and the coupled electric field of the external conductive layer 210 on the circuit board 200 to the conductive portion 101 of the light emitting module 100, thereby weakening the interference electromagnetic waves in the circuit board 200. In some embodiments of the present disclosure, a resistivity of the conductive structure 300 is less than 0.1 Ω·cm along a direction perpendicular to the back face 102 of the light emitting module. In this way, it can be ensured that the conductive structure 300 has a good conductive effect, and a dispersion speed of the coupled charges and the coupled electric field is improved.

In some embodiments of the present disclosure, referring to FIG. 1, a conductive material is used for the back face 102 of the light emitting module; in other words, the back face 102 of the light emitting module is the conductive portion 101 of the light emitting module 100. For example, the back face 102 of the light emitting module is a back plate of a backlight source, and the back plate of the backlight source is a metal back plate.

In some embodiments of the present disclosure, the conductive structure 300 can be a conductive structure 300 with a deformation ability, so as to be able to fully contact the external conductive layer 210 and the back face 102 of the light emitting module, and reduce contact resistances with the external conductive layer 210 and the back face 102 of the light emitting module. For example, the conductive structure 300 may be a conductive foam or a conductive adhesive layer. A thickness of the conductive foam or the conductive adhesive layer can be determined according to the gap between the external conductive layer 210 and the back face 102 of the light emitting module, so as to be able to be better electrically coupled to both the external conductive layer 210 and the back face 102 of the light emitting module without affecting the attaching of the circuit board 200 and the back face of the backlight module.

In some embodiments of the present disclosure, referring to FIGS. 7 to 10, the display device further includes a thermally conductive structure 400. At least a partial area of the external conductive layer 210 is electrically coupled to the back face 102 of the light emitting module through the conductive structure 300, and the remaining area of the external conductive layer 210 is electrically coupled to the back face 102 of the light emitting module through the thermally conductive structure 400. In FIGS. 7 to 10, a boundary of the external conductive layer 210 denoted by a dotted frame is larger than the range of the thermally conductive structure 400 and the conductive structure 300, this is to clearly distinguish the boundary of the external conductive layer 210 from the boundaries of the thermally conductive structure 400 and the conductive structure 300. In practical applications, the total range of the thermally conductive structure 400 and the conductive structure 300 may be coincident with the range of the external conductive layer 210.

In this way, the heat generated by the electronic components on the circuit board 200 upon operating, such as the heat generated by the power management chip upon operating, can be conducted to the external conductive layer 210 along the easily thermally conductive metal wiring layer 270 and the metal post 250, and then conducted to the light emitting module 100 through the thermally conductive structure 400, thereby improving a heat dissipation capability of the circuit board 200, especially a heat dissipation capability of the power management chip.

In some embodiments of the present disclosure, the thermally conductive structure 400 includes a thermally conductive silicone grease layer. A material of the thermally conductive silicone grease layer may be thermally conductive silicone grease, which can effectively connect the external conductive layer 210 and the back face 102 of the light emitting module, so as to avoid degradation in a thermal conductivity effect caused by poor contact.

Figure 7:
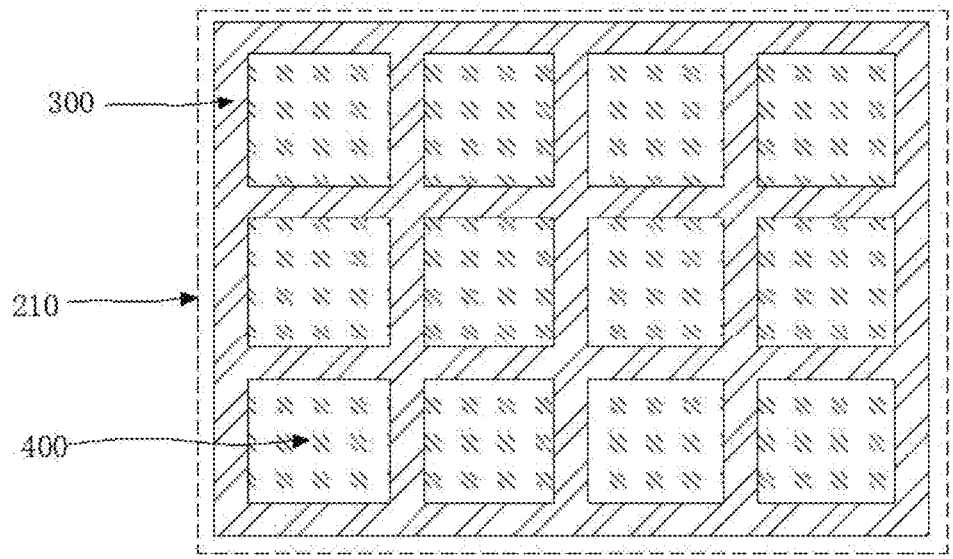
FIG. 7 is a schematic top view of a distribution of a conductive structure and a thermally conductive structure on an external conductive layer according to an embodiment of the present disclosure.
Figure 8:
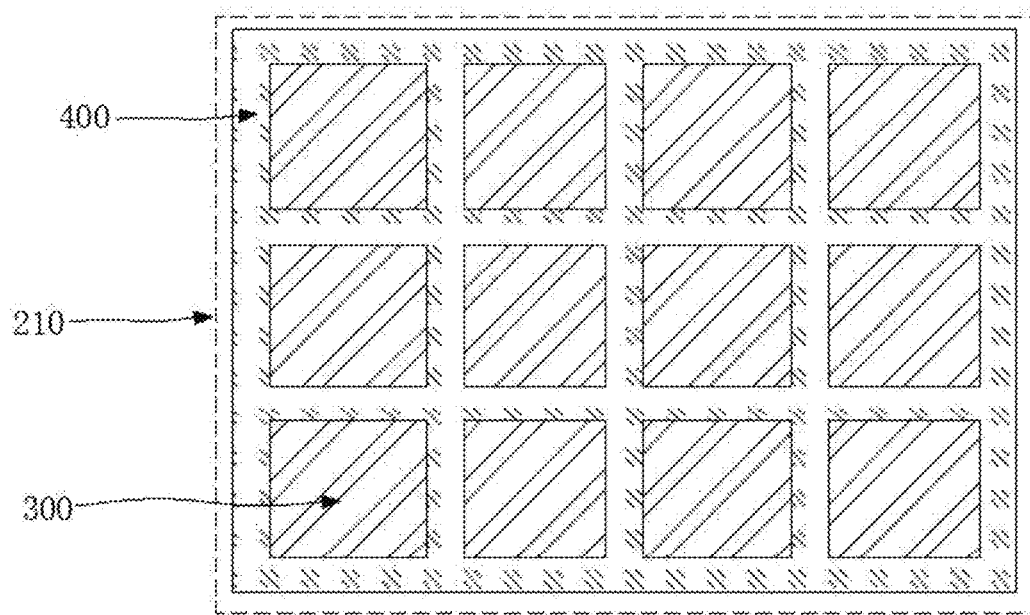
FIG. 8 is a schematic top view of a distribution of a conductive structure and a thermally conductive structure on an external conductive layer according to an embodiment of the present disclosure.

For example, in an embodiment, referring to FIGS. 7 and 8, an orthographic projection of one of the conductive structure 300 and the thermally conductive structure 400 on the external conductive layer 210 forms a grid shape, and an orthographic projection of the other on the external conductive layer 210 is located in the mesh of the grid shape.

For example, referring to FIG. 7, the orthographic projection of the conductive structure 300 on the external conductive layer 210 forms the grid shape, and the orthographic projection of the thermally conductive structure 400 on the external conductive layer 210 may be filled in the grid shape.

For another example, referring to FIG. 8, the orthographic projection of the thermally conductive structure 400 on the external conductive layer 210 forms the grid shape, and the orthographic projection of the conductive structure 300 on the external conductive layer 210 may be filled in the grid shape.

Figure 9:
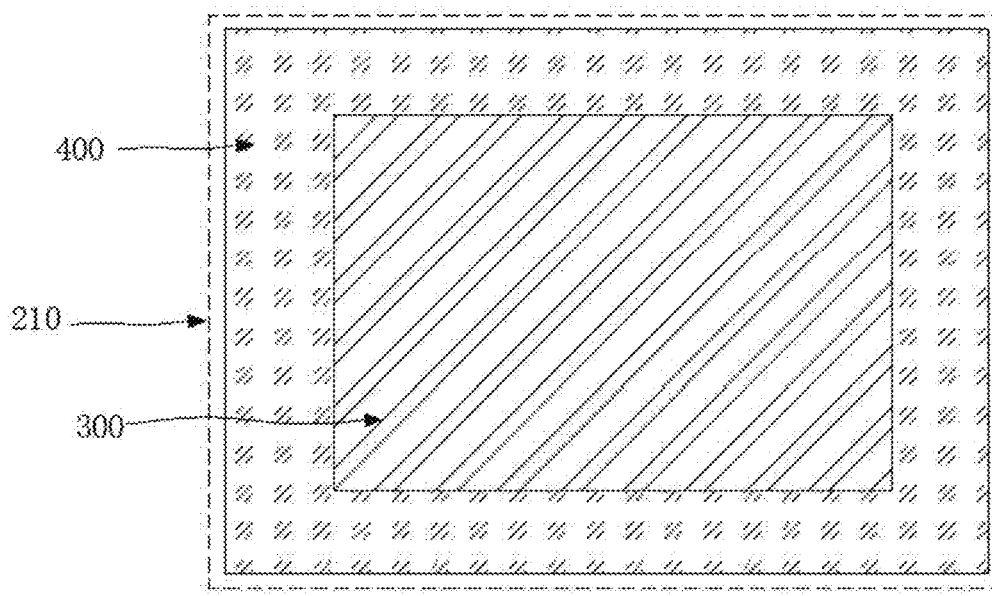
FIG. 9 is a schematic top view of a distribution of a conductive structure and a thermally conductive structure on an external conductive layer according to an embodiment of the present disclosure.
Figure 10:
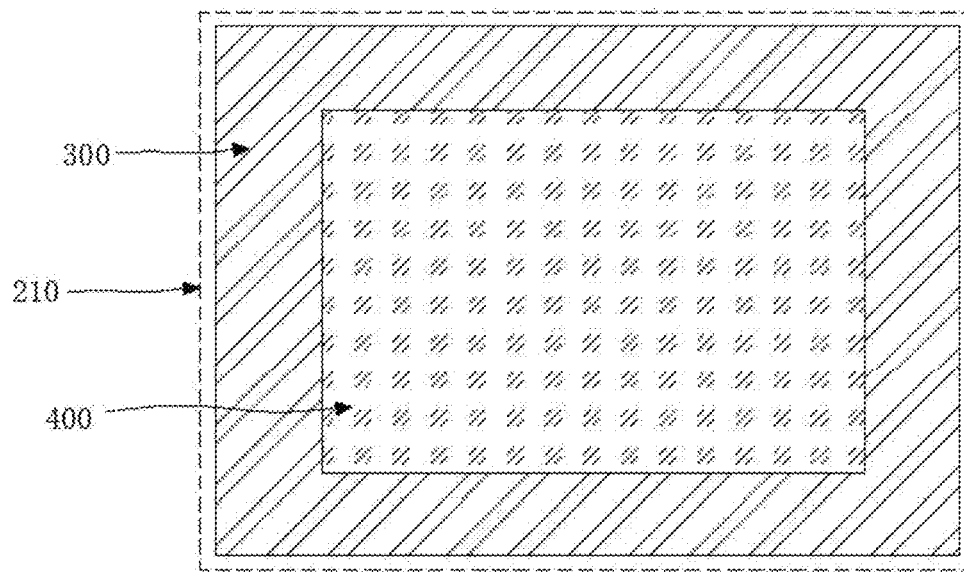
FIG. 10 is a schematic top view of a distribution of a conductive structure and a thermally conductive structure on an external conductive layer according to an embodiment of the present disclosure.

In another embodiment, referring to FIG. 9 and FIG. 10, the orthographic projection of one of the conductive structure 300 and the thermally conductive structure 400 on the external conductive layer 210 is a ring shape along edges of the external conductive layer 210, and the orthographic projection of the other on the external conductive layer 210 is located within the inner edge of the ring shape.

For example, referring to FIG. 9, the orthographic projection of the thermally conductive structure 400 on the external conductive layer 210 is the ring shape along the edges of the external conductive layer 210, and the ring shape has a hollow cavity. The orthographic projection of the conductive structure 300 on the external conductive layer 210 is located within the inner edge of the ring shape, that is, the conductive structure 300 is located in the cavity. Further, the cavity is filled with the conductive structure 300, that is, an outer edge of an orthographic projection of the conductive structure 300 on the external conductive layer 210 coincides with an inner edge of the orthographic projection of the thermally conductive structure 400 on the external conductive layer 210.

For another example, referring to FIG. 10, the orthographic projection of the conductive structure 300 on the external conductive layer 210 is the ring shape along the edges of the external conductive layer 210, and the ring shape has the hollow cavity. The orthographic projection of the thermally conductive structure 400 on the external conductive layer 210 is located within the inner edge of the ring shape, that is, the thermally conductive structure 400 is located in the cavity. Further, the cavity is filled with the thermally conductive structure 400, that is, an outer edge of the orthographic projection of the thermally conductive structure 400 on the external conductive layer 210 coincides with an inner edge of the orthographic projection of the conductive structure 300 on the external conductive layer 210.

In some embodiments of the present disclosure, a ratio of an area of the conductive structure 300 to an area of the thermally conductive structure 400 is 0.8-1.2, so that it can be ensured that both the heat dissipation performance and the anti-electromagnetic interference performance of the circuit board 200 are better improved.

In other embodiments of the present disclosure, referring to FIG. 2, the back face 102 of the light emitting module is an insulating material. The conductive structure 300 includes a conductive tape attached to the back face 102 of the light emitting module and coupled to the conductive portion 101. The circuit board 200 is disposed on a side of the conductive tape away from the light emitting module 100, and the external conductive layer 210 is electrically coupled to the conductive tape.

For example, referring to FIG. 2, the back face 102 of the light emitting module is the insulating material, and a frame 103 of the light emitting module is a conductive metal material, then the frame 103 of the light emitting module is the conductive portion 101 of the light emitting module 100. The conductive tape as the conductive structure 300 can be attached to the back face 102 of the light emitting module, one end of the conductive tape can be extended to be coupled with the frame 103, and the other end can be extended between the circuit board 200 and the light emitting module 100 and adhered to the external conductive layer 210.

Figure 11:
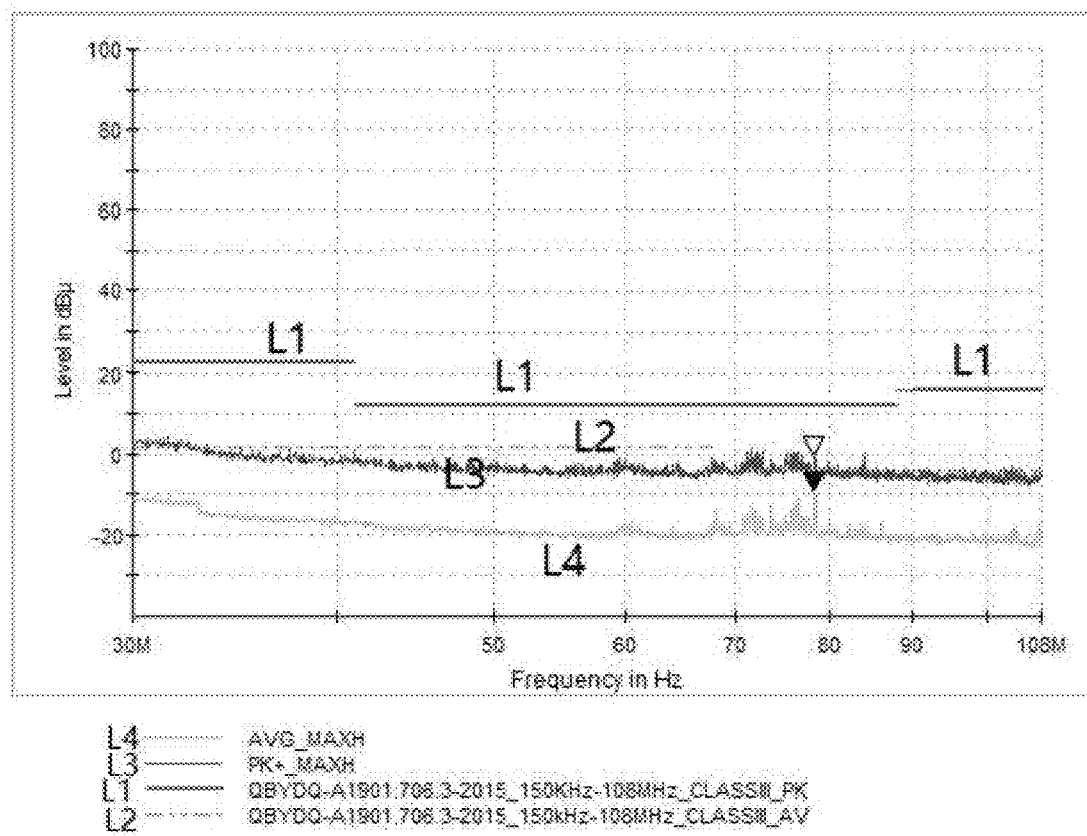
FIG. 11 is an electromagnetic interference test result of a circuit board according to an embodiment of the present disclosure.

The present disclosure also tests an interference situation of the circuit board of the above-mentioned display device, and test results are shown in FIG. 11. Referring to FIG. 11, a line segment L1 is a specification line for a peak value; L2 is a specification line for an average value; L3 represents an actually measured data of the peak value; L4 represents an actually measured data of the average value. In order to distinguish L1/L3 from L2/L4, reference coordinates of L2/L4 are moved down. When the actually measured data of the peak value exceeds the specification line for the peak value, it indicates that the circuit board does not meet the electromagnetic interference control standards; and when the actually measured data of the average value exceeds the specification line for the average value, it indicates that the circuit board does not meet the electromagnetic interference control standards. Referring to FIG. 11, in the display device of the present disclosure, neither the actually measured data of the peak value nor the actually measured data of the average value exceeds the corresponding specification line, thus the circuit board meets the electromagnetic interference control standards.

The present disclosure also provides a circuit board 200. Referring to FIGS. 3 to 6, the circuit board 200 includes the first surface 201 and the second surface 202 disposed oppositely. The resistive device 261 and the capacitive device 262 of the circuit board 200 are disposed on the second surface 202, the first surface 201 of the circuit board 200 has the exposed external conductive layer 210, and the external conductive layer 210 is electrically coupled to the ground wire 220 of the circuit board 200.

In this way, upon application, the circuit board 200 of the present disclosure can make the first surface 201 face a carrier and be attached to the carrier, and the external conductive layer 210 is electrically coupled with the conductive portion 101 of the carrier through the conductive structure 300. In this way, when the circuit board 200 is in operation, the interference electromagnetic waves generated on the circuit board 200 can be partially conducted to the external conductive layer 210, so that the external conductive layer 210 generates the coupled charges and the coupled electric field, and these coupled charges and the coupled electric field can be quickly dispersed into the conductive portion 101 of the carrier via the conductive structure 300, thereby accelerating the dissipation of the coupled charges and the coupled electric field, and reducing the interference electromagnetic waves on the circuit board 200. The external conductive layer 210 is located on the first surface 201 close to the carrier, and the conductive structure 300 is located between the circuit board 200 and the carrier, thus there is a smaller distance between the external conductive layer 210 and the conductive portion 101 of the carrier, so that the coupled charges and the coupled electric field can be dissipated more quickly, thereby improving the effect of reducing the interference electromagnetic waves. More importantly, the coupled charges and the coupled electric field generated on the external conductive layer 210 can be directly transmitted through the conductive structure 300 located outside the circuit board 200, reducing the transmission of the coupled charges and the coupled electric field inside the circuit board 200 through the ground wire 220 of the circuit board 200, which can more effectively eliminate the interference of the interference electromagnetic waves on the signal transmission lead 230 in the circuit board 200. Not only that, when the static electricity is generated on the circuit board 200, the generated static electricity can also be dispersed to the conductive portion 101 of the carrier through the external conductive layer 210 and the conductive structure 300, thereby dispersing the electrostatic charges and avoiding the occurrence of electrostatic breakdown.

For example, the carrier may be the light emitting module 100, and in this way, the display device described in display device embodiments of the present disclosure can be obtained. The display device provided by the present disclosure is an application example of the circuit board 200, which has disclosed the details, principles and effects of the circuit board 200 of the present disclosure. Alternatively, the structures, principles and effects of the circuit board 200 of the present disclosure can be reasonably deduced according to the descriptions in the display device embodiments of the present disclosure, which are not repeated here.

In an embodiment of the present disclosure, the circuit board 200 includes the signal transmission area A, and the signal transmission lead 230 is disposed in the signal transmission area A. The external conductive layer 210 includes the first external conductive layer 211, and the orthographic projection of the first external conductive layer 211 on the base substrate of the circuit board 200 is located within the signal transmission area A.

In an embodiment of the present disclosure, the circuit board 200 includes the power management area B, and the power management circuit is disposed in the power management area B. The external conductive layer 210 includes the second external conductive layer 212, and the orthographic projection of the second external conductive layer 212 on the base substrate of the circuit board 200 is located within the power management area B.

In an embodiment of the present disclosure, the circuit board 200 includes the plurality of metal wiring layers 270 that are stacked, and the external conductive layer 210 is located on the first metal wiring layer 271 closest to the first surface 201.

In an embodiment of the present disclosure, the external conductive layer 210 is the non-hollow structure.

It should be understood that the present disclosure is not limited to the detailed structures and arrangements of the components proposed by the present specification. The present disclosure is capable of having other embodiments, and be carried out and implemented in various manners. The foregoing variations and modifications fall within the scope of the present disclosure. It should be understood that the present disclosure disclosed and defined by the present specification extends to all alternative combinations of two or more of the individual features apparent or recited herein and/or in the drawings. All of these various combinations constitute a number of alternative aspects of the present disclosure. The embodiments described in the present specification are illustrative of the best mode for carrying out the present disclosure and will enable those skilled in the art to utilize the present disclosure.

What is claimed is:
1. A display device, comprising:
a light emitting module, wherein a surface of the light emitting module is provided with a conductive portion;
a circuit board, disposed at a back face of the light emitting module and provided with a first surface close to the light emitting module, wherein the first surface of the circuit board is provided with an exposed external conductive layer, and the external conductive layer is electrically coupled to a ground wire of the circuit board; and
a conductive structure, located between the circuit board and the light emitting module, and configured to electrically couple the external conductive layer to the conductive portion,
wherein the circuit board comprises a signal transmission area, and the signal transmission area is provided with a signal transmission lead; and
the external conductive layer comprises a first external conductive layer and an orthographic projection of the first external conductive layer on a base substrate of the circuit board is located within the signal transmission area.

2. The display device according to claim 1, wherein the circuit board comprises a power management area, and the power management area is provided with a power management circuit; and the external conductive layer comprises a second external conductive layer, and an orthographic projection of the second external conductive layer on a base substrate of the circuit board is located within the power management area.

3. The display device according to claim 1, wherein the circuit board comprises a plurality of metal wiring layers that are stacked, wherein a first metal wiring layer closest to the first surface is provided with the external conductive layer.

4. The display device according to claim 1, wherein the circuit board is provided with a second surface away from the light emitting module; and a capacitive device and a resistive device of the circuit board are disposed on the second surface of the circuit board.

5. The display device according to claim 1, wherein a conductive material is used for the back face of the light emitting module; and the conductive structure is a conductive foam or a conductive adhesive layer.

6. The display device according to claim 1, wherein the display device further comprises a thermally conductive structure; and at least a partial area of the external conductive layer is electrically coupled to the back face of the light emitting module through the conductive structure, and a remaining area of the external conductive layer is electrically coupled to the back face of the light emitting module through the thermally conductive structure.

7. The display device according to claim 6, wherein a grid shape is formed by an orthographic projection of one of the conductive structure and the thermally conductive structure on the external conductive layer, and an orthographic projection of the other one of the conductive structure and the thermally conductive structure on the external conductive layer is located in a mesh of the grid shape; or the orthographic projection of one of the conductive structure and the thermally conductive structure on the external conductive layer is a ring shape along an edge of the external conductive layer, and the orthographic projection of the other one of the conductive structure and the thermally conductive structure on the external conductive layer is located within an inner edge of the ring shape.

8. The display device according to claim 1, wherein the back face of the light emitting module is insulative; and the conductive structure comprises a conductive tape attached to the back face of the light emitting module and coupled to the conductive portion, the circuit board is disposed on a side of the conductive tape away from the light emitting module, and the external conductive layer is electrically coupled with the conductive tape.

9. A circuit board, comprising a first surface and a second surface disposed oppositely; wherein a resistive device and a capacitive device of the circuit board are disposed on the second surface; and the first surface of the circuit board is provided with an exposed external conductive layer, and the external conductive layer is electrically coupled to a ground wire of the circuit board, wherein the circuit board comprises a signal transmission area, and the signal transmission area is provided with a signal transmission lead; and the external conductive layer comprises a first external conductive layer, and an orthographic projection of the first external conductive layer on a base substrate of the circuit board is located within the signal transmission area.

10. The circuit board according to claim 9, wherein the circuit board comprises a power management area, and the power management area is provided with a power management circuit; and the external conductive layer comprises a second external conductive layer, and an orthographic projection of the second external conductive layer on the base substrate of the circuit board is located within the power management area.

11. The circuit board according to claim 9, wherein the circuit board comprises a plurality of metal wiring layers that are stacked, and a first metal wiring layer closest to the first surface is provided with the external conductive layer.

\* \* \* \* \*